(12) United States Patent (10) Patent No.: US 9,411,924 B2
Wang et al. (45) Date of Patent: Aug. 9, 2016

(54) METHODOLOGY FOR PATTERN DENSITY OPTIMIZATION

(71) Applicant: Taiwan Semiconductor Manufacturing Co., Ltd., Hsin-Chu (TW)

(72) Inventors: Hung-Chun Wang, Taichung (TW); Ming-Hui Chih, Luzhou (TW); Ping-Chieh Wu, New Taipei (TW); Chun-Hung Wu, Hsinchu (TW); Wen-Hao Liu, Zhubei (TW); Cheng-Hsuan Huang, New Taipei (TW); Cheng-Kun Tsai, Hsinchu (TW); Wen-Chun Huang, Tainan (TW); Ru-Gun Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/051,549

(22) Filed: Oct. 11, 2013

(65) Prior Publication Data

US 2015/0106779 A1 Apr. 16, 2015

(51) Int. Cl.
*G06F 17/50* (2006.01)
*G03F 1/36* (2012.01)

(52) U.S. Cl.
CPC .............. *G06F 17/5081* (2013.01); *G03F 1/36* (2013.01)

(58) Field of Classification Search
USPC ........................................................ 716/54
See application file for complete search history.

(56) References Cited

U.S. PATENT DOCUMENTS

| 7,014,955 | B2 | 3/2006 | Chang et al. |
| 2007/0124718 | A1 | 5/2007 | Kobayashi et al. |
| 2007/0245284 | A1 | 10/2007 | Sinha et al. |
| 2009/0031261 | A1 | 1/2009 | Smith et al. |
| 2009/0049420 | A1* | 2/2009 | Kobayashi ............. 716/19 |
| 2009/0064083 | A1* | 3/2009 | Ikeuchi ................. 716/19 |
| 2009/0181314 | A1 | 7/2009 | Shyu et al. |
| 2011/0204470 | A1* | 8/2011 | Cheng et al. ......... 257/499 |
| 2011/0241207 | A1 | 10/2011 | Kuo et al. |
| 2013/0132918 | A1* | 5/2013 | Ferguson et al. .... 716/112 |
| 2013/0246981 | A1 | 9/2013 | Chiang et al. |
| 2013/0326434 | A1 | 12/2013 | Feng |

OTHER PUBLICATIONS

Office Action Dated May 22, 2014 U.S. Appl. No. 14/051,568.
U.S. Appl. No. 14/051,568, filed Oct. 11, 2013. 27 Pages.
Notice of Allowance Dated Nov. 19, 2014 U.S. Appl. No. 14/051,568.

* cited by examiner

*Primary Examiner* — Eric Lee
(74) *Attorney, Agent, or Firm* — Eschweiler & Associates, LLC

(57) ABSTRACT

The present disclosure relates to a method of improving pattern density with a low OPC (optical proximity correction) cycle time, and an associated apparatus. In some embodiments, the method is performed by forming an integrated chip (IC) design that is a graphical representation of an integrated chip. One or more low-pattern-density areas of the IC design are identified having a pattern density that results in a processing failure. The low-pattern-density areas are a subset of the IC design. The pattern density is adjusted within the low-pattern-density area by adding one or more dummy shapes within the low-pattern-density areas. A data preparation process is then performed on the IC design to modify shapes of the one or more dummy shapes within the low-pattern-density areas. By introducing dummy shapes into a local area, rather than into an entire integrated chip design, the demands of the subsequent data preparation process are reduced.

20 Claims, 4 Drawing Sheets

METHODOLOGY FOR PATTERN DENSITY OPTIMIZATION

The pattern density of an integrated chip (IC) design is a parameter that describes a concentration of a design level (e.g., a metal interconnect layer) within the design. For example, the pattern density of a metal layer within an IC design may be determined by dividing the area of the metal layer by the total area of the design. The pattern density of an IC design is carefully monitored during the design phase of integrated chip development. This is because the pattern density of an IC design impacts corresponding on-wafer structures.

For example, chemical mechanical polishing (CMP) processes used to planarize a substrate are sensitive to the pattern density of the substrate. In areas of the substrate where a pattern density of a metal layer is above the processing specifications of a CMP tool the substrate will dish, resulting in a non-planar substrate that can lead to defects and yield problems.

DETAILED DESCRIPTION

Figure 1:
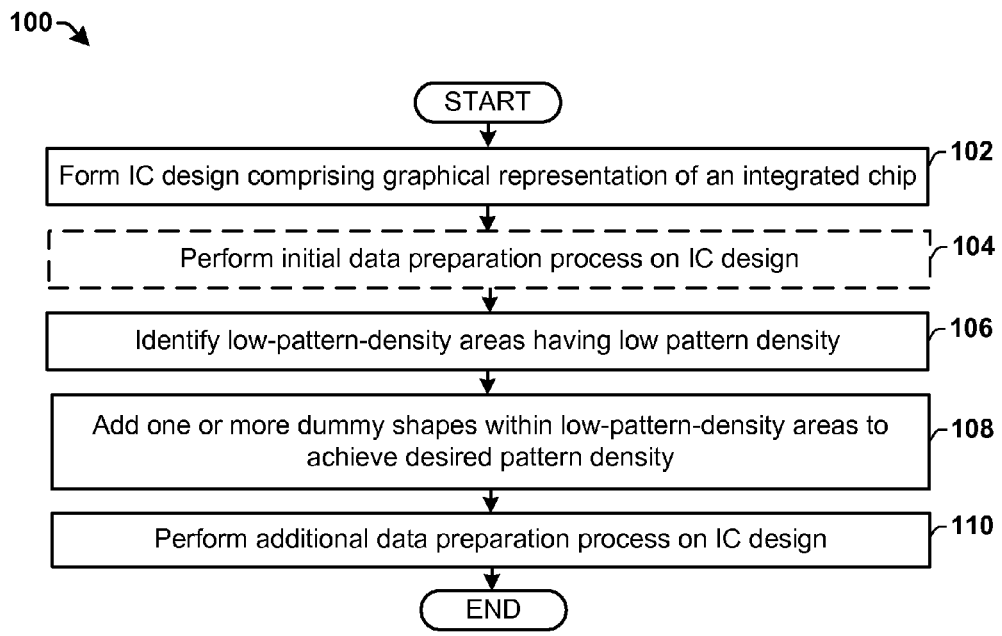
FIG. 1 illustrates a flow diagram of some embodiments of a method of improving pattern density by adding dummy shapes within low-pattern-density areas that are a subset of an integrated chip design.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Data preparation processes are automated processes that are used to modify design data so that a design is accurately formed on a wafer. Data preparation process may be used to introduce dummy shapes into an integrated chip (IC) design to control (e.g., vary) a pattern density of the IC design. The addition of such dummy shapes provides for a tight pattern density control that reduces defects and improves yield.

Typically, dummy shapes may be added throughout an entire IC design to improve pattern density. The dummy shapes are then subjected to optical proximity correction (OPC), which may selectively modify the shape of the dummy shapes so that the dummy shapes print properly on wafer. However, adding dummy shapes to an entire IC design results in a large number of dummy shapes in the design, which in turn consumes a large number of development resources and drives a large OPC cycle time.

Accordingly, the present disclosure relates to a method of improving pattern density with a low OPC (optical proximity correction) cycle time, and an associated apparatus. In some embodiments, the method comprises forming an integrated chip (IC) design comprising a graphical representation of an integrated chip. One or more low-pattern-density areas of the IC design are identified, which have a pattern density that results in a processing failure (e.g., on-wafer defect). The low-pattern-density areas comprise a subset of the IC design. The pattern density is adjusted within the low-pattern-density area by adding one or more dummy shapes within the low-pattern-density areas. A data preparation process is then performed on the integrated chip design that modifies shapes of the one or more dummy shapes within the low-pattern-density areas. By introducing dummy shapes into the local area, rather than into an entire integrated chip design, the demands of the subsequent data preparation process (e.g., OPC, data pretreatment, etc.) are reduced. This is because the data preparation process is performed on a relatively small number of dummy shapes within the low-pattern-density area rather than on a relatively large number of dummy shapes throughout the entire IC design.

FIG. 1 illustrates a flow diagram of some embodiments of a method 100 of improving pattern density by adding dummy shapes within low-pattern-density areas that are a subset of an integrated chip design.

At 102, an integrated chip (IC) design comprising a graphical representation of an integrated chip is formed. The IC design comprises a plurality of shapes corresponding to structures that are to be formed on an integrated chip.

At 104, an initial data preparation process of an integrated chip design may be performed, in some embodiments. The initial data preparation process modifies the shapes in the IC design to improve the accuracy of critical dimension under nominal conditions or the process window of the design (i.e., to make on-wafer shapes more closely correspond to the shapes in the IC design by accounting for changes in the design due to processing).

At 106, one or more low-pattern-density areas having a low pattern density are identified. The low-pattern-density areas having a low pattern density are areas that are a subset of the IC design, and which have a pattern density that causes processing hot spots that result in processing failures (e.g., defects, scumming, etc.). In some embodiments, the low-pattern-density areas have a pattern density falling outside of an optimum operating value of a processing tool defined by one or more pre-determined threshold values. For example, in some embodiments, a low-pattern-density area having a pattern density less than a predetermined threshold of 25% may result in dishing during a chemical mechanical polishing (CMP) process.

In some embodiments, the low-pattern-density areas may be identified by using a pattern recognition or pattern matching procedure. The pattern recognition or pattern matching procedure is configured to analyze shapes within the IC design to determine low-pattern-density areas of the IC design that have a low pattern density but high risk of failed lithography process. For example, a pattern recognition procedure may analyze portions of an IC design to identify predetermined patterns that are associated with process window issues (e.g., that fail to properly form on a wafer) due to low pattern density.

At 108, one or more dummy shapes are added in the low-pattern-density areas. The one or more dummy shapes increase the pattern density in the area of low pattern density, so that the pattern density no longer violates the threshold.

At 110, an additional data preparation process is performed on the integrated chip. The additional data preparation process comprises OPC that modifies the shapes of the IC design, including the one or more dummy shapes, to improve the process window of the IC design.

Therefore, method 100 identifies local areas of an integrated chip having a low pattern density and then introduces dummy shapes into the identified local areas. By introducing dummy shapes into the local areas, rather than into an entire integrated chip design, the demands of the subsequent data preparation process (e.g., OPC, data pretreatment, etc.) are reduced, thereby reducing the OPC cycle time of the additional data preparation process. This is because the data preparation process is performed on a relatively small number of dummy shapes within the local region rather than on a relatively large number of dummy shapes throughout the entire integrated chip design.

FIGS. 2-5 illustrate some embodiments of a substrate upon which a method of improving pattern density is performed. Although FIGS. 2-5 are described in relation to method 100, it will be appreciated that the structures disclosed in FIGS. 2-5 are not limited to such a method, but instead may stand alone as a structure.

Figure 2:
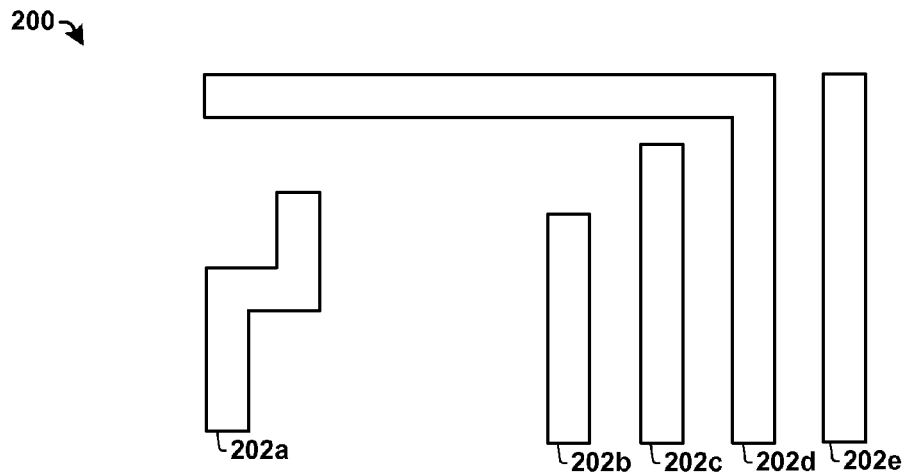
FIGS. 2-5 illustrate some embodiments of a substrate upon which a method of improving pattern density is performed.

FIG. 2 illustrates some embodiments of a top-view corresponding to act 102. The top-view shows an integrated chip (IC) design 200 comprising a graphical representation of an integrated chip. The IC design 200 comprises a plurality of shapes 202a-202e. In some embodiments, the IC design 200 may be formed by a designer using a design software program. In other embodiments, the IC design 200 may be formed by an automatic place and route tool configured to automatically place the plurality of shapes 202a-202e within the IC design 200.

In some embodiments, the plurality of shapes 202a-202e may comprise metal interconnect shapes. For example, the plurality of shapes 202a-202e may comprise metal shapes on a first back-end-of-the-line (BEOL) metal layer. In some embodiments, the IC design 200 may comprise a Graphic Database System (GDS) file, such as a GDS or GDSII file. In other embodiments, the IC design 200 may comprise a CIF file, an OASIS file, or some other similar file format, for example.

Figure 3:
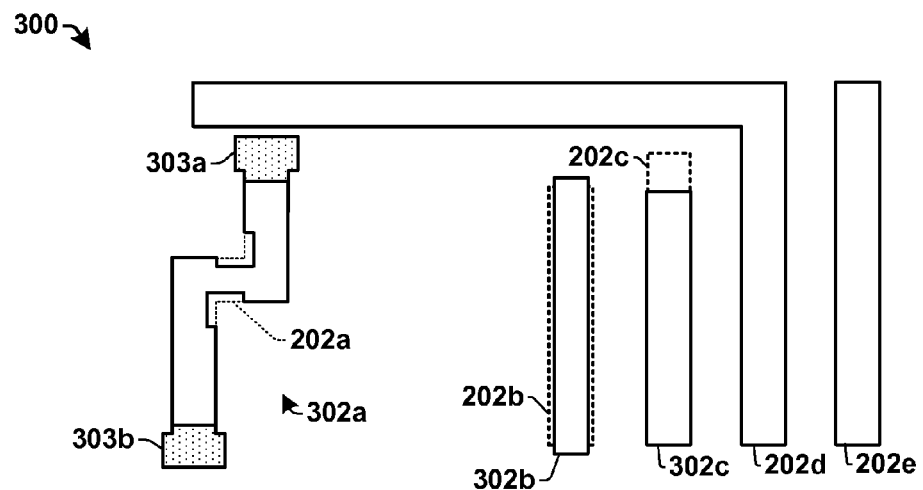

FIG. 3 illustrates some embodiments of a top-view 300 corresponding to act 104. As shown in top-view 300, one or more of the plurality of shapes 202a-202e may be operated upon by an initial data preparation process that modifies the shapes. By modifying one or more of the plurality of shapes 202a-202e, the process window can be improved, thereby allowing for on-wafer shapes to more closely correspond to the IC design 200. In some embodiments, the initial data preparation process may eliminate some low-density pattern issues by modifying the IC design.

In some embodiments, the data preparation process may comprise a data pretreatment configured to use models and/or simulations to determine how to vary one or more shapes in the IC design prior to OPC (optical proximity correction). For example, as shown in top-view 300, shape 202b is modified to improve a process window using data pretreatment to form a shape 302b having an improved process window. In other embodiments, the initial data preparation process may comprise an OPC configured to add one or more assist features to shapes within the IC design. For example, as shown in top-view 300, assist features 303a and 303b are added to shape 202a to form an OPC'd shape 302a. In some embodiments, the data preparation process may comprise a logic operation, such as a Boolean logic operation (e.g., to size up or size down a shape), performed on shapes of the IC design. For example, as shown in top-view 300, the size of shape 202c is reduced by a logic operation to form a shape 302c having a greater line end spacing.

Figure 4:
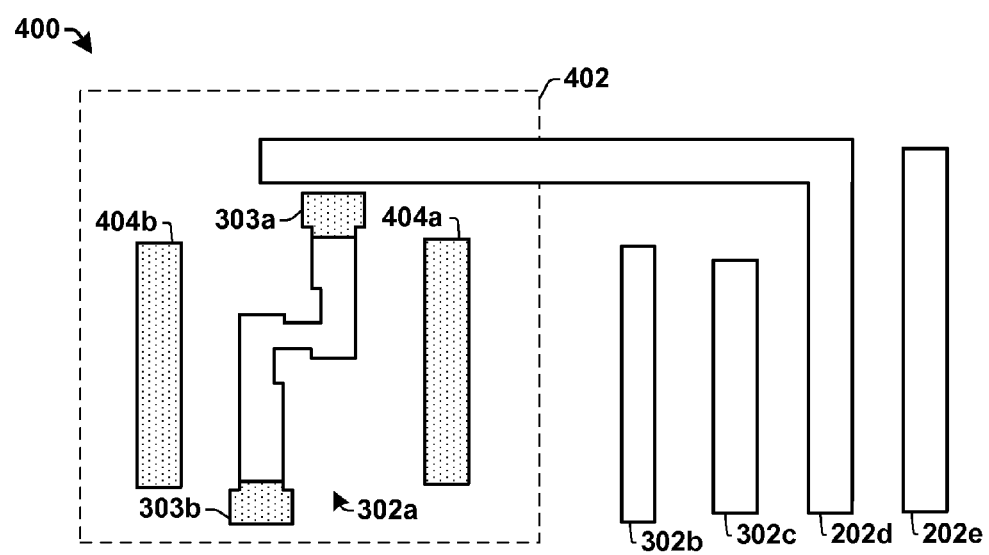

FIG. 4 illustrates some embodiments of a top-view 400 corresponding to act 106. As shown in top-view 400, a low-pattern-density area 402 having a low pattern density that causes processing hot spots (e.g., failure to print on wafer property) to arise is identified.

In some embodiments, the low-pattern-density area 402 is identified using a pattern recognition process configured to find a specific pattern having a processing issue. For example, in some embodiments, the pattern recognition process can compare a predetermined library of patterns to the IC design, wherein the predetermined library of patterns comprise patterns that are known to have processing issues. If the IC design contains one of the predetermined patterns or a variation thereof, the pattern recognition process identifies the pattern as a low-pattern-density area 402 and one or more dummy shapes, 404a and 404b, are introduced into the low-pattern-density area 402. The number of dummy shapes, 404a and 404b, that are introduced into the low-pattern-density area 402 may depend upon a pattern identified by the pattern recognition process. For example, if the pattern recognition procedure identifies a first low-pattern-density area a first number of dummy shapes 404 may be added, while if the pattern recognition procedure identifies a second low-pattern-density area a second number of dummy shapes 404, greater than the first number of dummy shapes, may be added.

Figure 5:
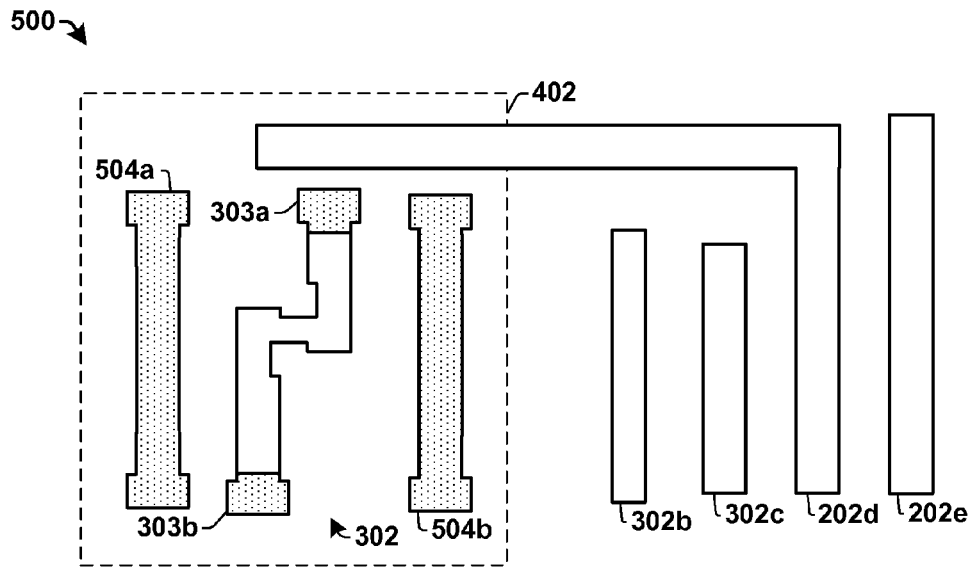

FIG. 5 illustrates some embodiments of a top-view 500 corresponding to act 108. As shown in top-view 500, an additional data preparation process is performed on one or more shapes within the IC design including the dummy shapes, 404a and 404b. The additional data preparation step is configured to modify the dummy shapes, 404a and 404b, to improve the process window, thereby allowing for on-wafer shapes to more closely correspond to the design data. In various embodiments, the additional data preparation process may comprise a logic operation (e.g., a Boolean logic operation to size up or size down a pattern), a data pretreatment, and/or OPC (optical proximity correction).

Figure 6:
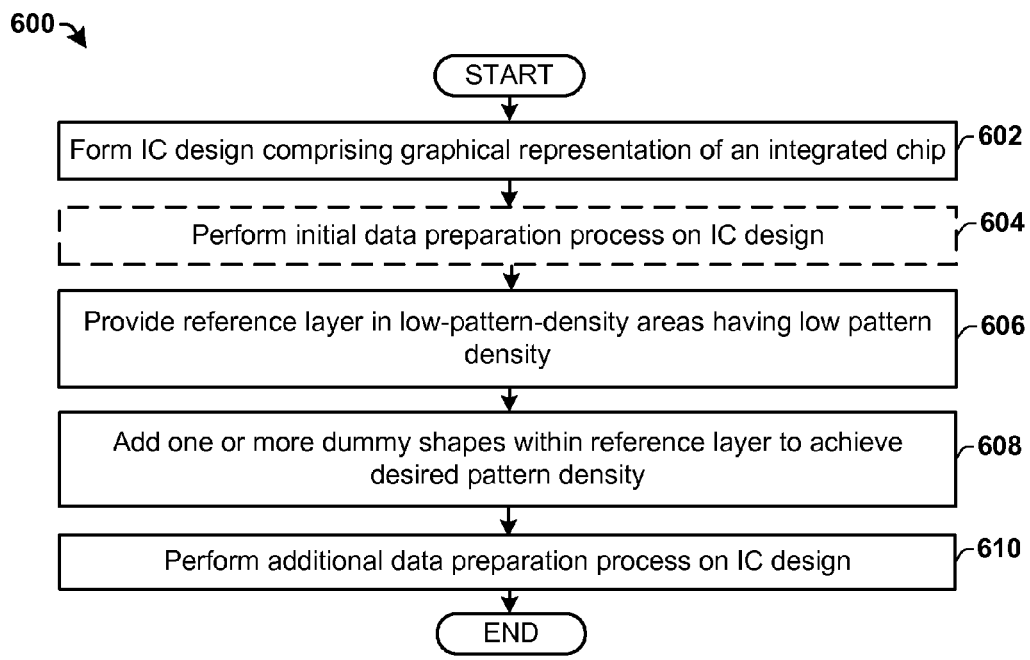
FIG. 6 illustrates a flow diagram of some alternative embodiments of a method of improving pattern density.

FIG. 6 illustrates a flow diagram of some alternative embodiments of a method 600 of improving pattern density by adding dummy shapes within low-pattern-density areas that are a subset of an integrated chip design.

While disclosed methods (e.g., methods 100, 600, and 700) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, an integrated chip (IC) design comprising a graphical representation of an integrated chip is formed.

At 604, an initial data preparation process of the IC design is performed. The initial data preparation process modifies the shapes in the IC design to improve the process window of the design (i.e., to make on-wafer shapes more closely correspond to the designed shapes by accounting for process variations).

At 606, a reference layer is provided into low-pattern-density areas having a low pattern density are identified. The reference layer comprises a marker design layer that indicates that the low-pattern-density area has a low pattern density.

In some embodiments, the reference layer may be manually placed by designers using a design software program. In other embodiments, the reference layer may be automatically placed by a post design software program. In some embodiments, the post design software program may be configured to analyze the IC design to identify low-pattern-density areas that have a pattern density that is below a threshold value (e.g., corresponding to an optimum operating value of a processing tool). Once a low-pattern-density area is identified, the reference layer is placed onto the identified area.

In some embodiments, post design software may be operated to identify low-pattern-density areas having a low pattern density using a simple rule based analysis. For example, the post design software program may divide a surface area within an analysis window by an area of a metal layer within the analysis window to determine a pattern density of the metal layer within the analysis window. In other embodiments, post design software may be operated to perform a simulation of the IC design to determine where low-pattern-density areas will arise.

At 608, one or more dummy shapes are added in the low-pattern-density areas covered by the reference layer. The one or more dummy shapes increase the pattern density in the low-pattern-density area of low pattern density, so that the pattern density no longer violates the threshold.

At 610, an additional data preparation process is performed on the IC design. The additional data preparation process modifies the shapes of the IC design, including the one or more dummy shapes, to improve the process window of the design.

Figure 7:
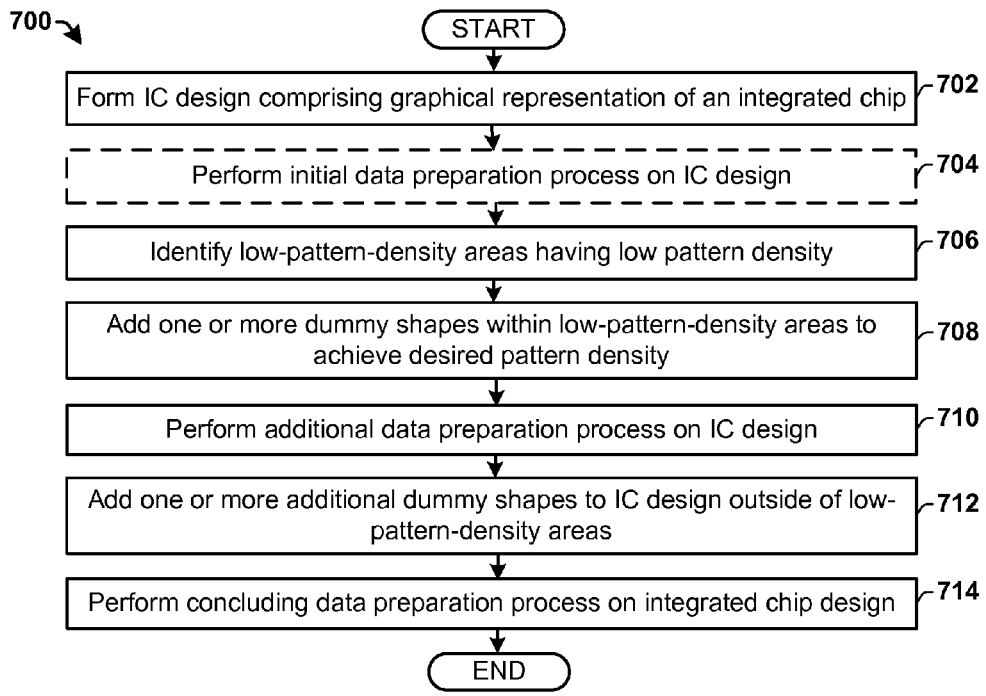
FIG. 7 illustrates a flow diagram of some alternative embodiments of a method of improving pattern density.

FIG. 7 illustrates a flow diagram of some alternative embodiments of a method 700 of improving pattern density by adding dummy shapes within low-pattern-density areas that are a subset of an integrated chip design.

At 702, an integrated chip (IC) design comprising a graphical representation of an integrated chip is formed.

At 704, an initial data preparation process of an IC design is performed. The initial data preparation process modifies the shapes in the IC design to improve the process window of the design (i.e., to make on-wafer shapes more closely correspond to the designed shapes by accounting for process variations).

At 706, low-pattern-density areas having a low pattern density are identified. In some embodiments, the low-pattern-density areas may be identified by using a pattern recognition or pattern matching procedure, as described above. In some embodiments, the low-pattern-density areas may be identified by monitoring the correlation between pattern density and yield of lithography process. In other embodiments, the low-pattern-density areas may be identified during OPC (optical proximity correction) by checking pattern density directly or by placing a pre-defined marker design layer over low-pattern-density areas having a low pattern density.

At 708, one or more dummy shapes are added in the low-pattern-density areas. The one or more dummy shapes increase the pattern density in the low-pattern-density areas, so that the pattern density no longer violates the threshold.

At 710, an additional data preparation process is performed on the IC design. The additional data preparation process modifies the shapes of the IC design, including the one or more dummy shapes within the low-pattern-density areas, to improve the process window of the IC design.

At 712, one or more additional dummy shapes are added in the areas of the IC design outside of the identified low-pattern-density areas having a low pattern density.

At 714, a concluding data preparation process is performed on the IC design. The concluding data preparation process modifies the shapes of the IC design, including the one or more additional dummy shapes outside of the low-pattern-density areas, to improve the process window of the IC design.

By performing the additional data preparation process on the dummy shapes added within the low-pattern-density area and subsequently performing the concluding data preparation process on dummy shapes added outside of the low-pattern-density area, the OPC cycle time may be reduced. This is because the additional dummy pattern insertion is limited to areas with low pattern density instead of the entire IC design, thereby reducing the overall number of dummy shapes and reducing cycle time.

Figure 8:
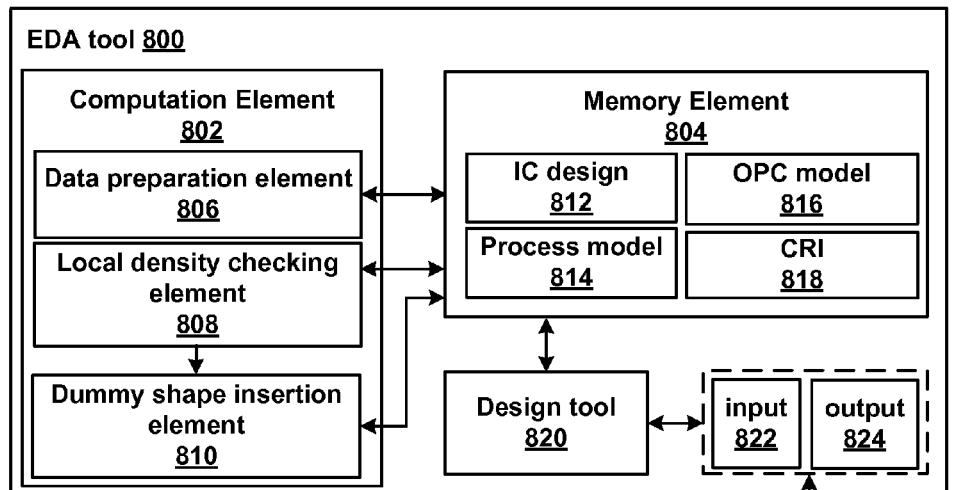
FIG. 8 illustrates a block diagram of some embodiments of an EDA (Electronic design automation) tool configured to execute the disclosed method of improving pattern density.

FIG. 8 illustrates a block diagram of some embodiments of an EDA (Electronic design automation) tool 800 configured to execute the disclosed method of improving pattern density.

The EDA tool 800 comprises a computation element 802 and a memory element 804. The computation element 802 comprises a data preparation element 806, a local density checking element 808, and a dummy shape insertion element 810. The memory element 804 is configured to store an integrated chip (IC) design 812 (e.g., a GDS or GDSII file, a CIF file, or an OASIS file or other design format), a process model 814, an OPC (optical proximity correction) model 816, and computer readable instructions (CRI) 818 may provide for a method of operating one or more components of the mask generation tool according to a disclosed method (e.g., method 100, 600, and/or 700). In various embodiments, the memory element 804 may comprise an internal memory or a computer readable medium.

The data preparation element 806 is configured to selectively operate upon the IC design 812 to modify the one or more shapes within the IC design 812 to improve the process window of the IC design 812 (i.e., to make on wafer shapes more closely correspond to the designed shapes by accounting for process variations). In some embodiments, the data preparation element 806 is configured to access the OPC model 816 to add one or more assist features to shapes within the IC design 812. In other embodiments, the data preparation element 806 is configured to access the process model 814 to perform a data pretreatment that modifies one or more shapes within the IC design 812 to improve the process window of the IC design 812 (i.e., to make on-wafer shapes more closely represent the IC design).

The local density checking element 808 is configured to selectively operate upon the IC design 812 to determine low-pattern-density areas within the IC design 812. The dummy shape insertion element 810 is configured to insert dummy shapes into the low-pattern-density areas.

The EDA tool 800 further comprises a design tool 820 configured to generate the IC design 812. In some embodiments, the design tool 820 may comprise an automatic place and route tool configured to selectively route shapes on a plurality of design levels to generate the IC design 812. In other embodiments, the design tool 820 may comprise a user interactive design environment that allows for designers to generate the IC design 812. In such embodiments, the EDA tool 800 may comprise an input device 822 and/or an output device 824. The input device 822 is configured to allow a user to interact with the IC design 812 and in various embodiments may comprise a keyboard, mouse, and/or any other input device. The output device 824 is configured to provide a graphical representation of the IC design 812 that can be viewed by a user. In various embodiments, the output device 824 may comprise a monitor, for example.

It will be appreciated that while reference is made throughout this document to exemplary structures in discussing aspects of methodologies described herein (e.g., the structure presented in FIGS. 2-5, while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a method of improving pattern density with a low OPC (optical proximity correction) cycle time, and an associated apparatus.

In some embodiments, the present disclosure relates to a method for pattern density optimization. The method comprises forming an integrated chip (IC) design comprising a graphical representation of an integrated chip. The method further comprises identifying one or more low-pattern-density areas of the IC design having a pattern density that results in a processing failure, wherein respective low-pattern-density areas comprise a subset of the IC design. The method further comprises adjusting the pattern density within the one or more low-pattern-density areas by adding one or more dummy shapes within the low-pattern-density areas. The method further comprises performing a data preparation process on the IC design that modifies shapes of the one or more dummy shapes within the low-pattern-density areas.

In other embodiments, the present disclosure relates to a method for pattern density optimization. The method comprises forming an integrated chip (IC) design comprising a graphical representation of an integrated chip. The method further comprises identifying one or more low-pattern-density areas of the IC design having a pattern density below a pre-determined threshold value, wherein respective low-pattern-density areas comprise a subset of the IC design. The method further comprises adjusting the pattern density within the low-pattern-density areas by adding one or more dummy shapes within the low-pattern-density areas without adding dummy shapes outside of the low-pattern-density areas. The method further comprises performing a data preparation process on the IC design that modifies shapes of the one or more dummy shapes within the low-pattern-density areas.

In yet other embodiments, the present disclosure relates to an EDA (Electronic design automation) tool. The EDA tool comprises a design tool configured to form an integrated chip (IC) design comprising a graphical representation of an integrated chip. The EDA further comprises a local density checking element configured to identify one or more low-pattern-density areas of the IC design having a pattern density that results in a processing failure, wherein respective low-pattern-density areas comprise a subset of the IC design. The EDA further comprises a dummy shape insertion element configured to adjust the pattern density within the one or more low-pattern-density areas by adding one or more dummy shapes within the low-pattern-density areas. The EDA further comprises a data preparation element configured to perform a data preparation process on the integrated chip design that modifies shapes of the one or more dummy shapes within the low-pattern-density areas.

What is claimed is:

1. A method for pattern density optimization, comprising:
    forming an integrated chip (IC) design comprising a graphical representation of a layout used to fabricate an integrated chip, using a computation element;
    performing an initial data preparation process on the IC design, using a data preparation element, to generate a modified IC design having modified shapes that are modified forms of shapes within the IC design;
    identifying one or more low-pattern-density areas of the modified IC design having a pattern density that results in a processing failure after performing the initial data preparation process using a local density checking element, wherein respective low-pattern-density areas comprise a subset of the IC modified design;
    adjusting the pattern density of the modified IC design within the one or more low-pattern-density areas by adding one or more dummy shapes within the one or more low-pattern-density areas using a dummy shape insertion element, wherein the one or more dummy shapes are separated from the modified shapes by a non-zero space; and
    performing a second data preparation process on the modified IC design that modifies shapes of the one or more dummy shapes within the one or more low-pattern-density areas using the data preparation element.

2. The method of claim 1, further comprising:
    performing a pattern recognition or pattern matching process that compares portions of the modified IC design to a predetermined library of patterns to identify predetermined patterns within the modified IC design that are associated with the one or more low-pattern-density areas.

3. The method of claim 2, further comprising:
    adding a number of dummy shapes into the one or more low-pattern-density areas, which varies depending on a pattern identified by the pattern recognition or the pattern matching process.

4. The method of claim 1, further comprising:
    placing a reference layer within the modified IC design that indicates locations of the low-pattern-density areas of the modified IC design.

5. The method of claim 4, wherein the reference layer is placed in the low-pattern-density areas that have a pattern density below a predetermined threshold value.

6. The method of claim 1, wherein the initial data preparation process comprises adding one or more assist features directly connected to the shapes within the IC design.

7. The method of claim 6, wherein the second data preparation process and the initial data preparation process comprise one or more of a data pretreatment that modifies the IC design by modeling the IC design, optical proximity correction (OPC), or a logic operation.

8. The method of claim 1, further comprising:
adding one or more additional dummy shapes in the modified IC design at positions outside of the low-pattern-density areas; and
performing a concluding data preparation process on the modified IC design after adding the one or more additional dummy shapes.

9. A method for pattern density optimization, comprising:
forming an integrated chip (IC) design comprising a graphical representation of a layout used to fabricate an integrated chip, using a computation element;
performing an initial data preparation process to generate a modified IC design having one or more modified shapes by adding one or more assist features directly connected to shapes within the IC design using a data preparation element, wherein the one or more modified shapes correspond to metal interconnect shapes;
identifying one or more low-pattern-density areas of the modified IC design having a pattern density below a pre-determined threshold value after performing the initial data preparation process using a local density checking element, wherein respective low-pattern-density areas comprise a subset of the modified IC design;
adjusting the pattern density within the one or more low-pattern-density areas by adding one or more dummy shapes within the one or more low-pattern-density areas without adding dummy shapes outside of the one or more low-pattern-density areas using a dummy shape insertion element; and
performing a second data preparation process on the modified IC design that modifies shapes of the one or more dummy shapes within the one or more low-pattern-density areas using the data preparation element.

10. The method of claim 9, further comprising:
performing a pattern recognition or pattern matching process that compares portions of the modified IC design to a predetermined library of patterns to identify predetermined patterns within the modified IC design that are associated with the one or more low-pattern-density areas.

11. The method of claim 10, further comprising:
adding a number of dummy shapes into the one or more low-pattern-density areas, which varies depending on a pattern identified by the pattern recognition or the pattern matching process.

12. The method of claim 9, further comprising:
placing a reference layer over a part of the IC design, wherein the reference layer indicates that locations of the IC design covered by the reference layer are the low-pattern-density areas of the modified IC design.

13. The method of claim 9, wherein the second data preparation process and the initial data preparation process comprise one or more of a data pretreatment that modifies the IC design by modeling the IC design, optical proximity correction (OPC), or a logic operation.

14. The method of claim 9, further comprising:
adding one or more additional dummy shapes in the modified IC design at positions outside of the low-pattern-density areas; and
performing a concluding data preparation process on the modified IC design after adding the one or more additional dummy shapes.

15. The method of claim 9,
wherein the integrated chip (IC) design has a first shape separated from a second shape by a non-zero space; and
wherein the one or more modified shapes are modified forms of the first shape or the second shape that are separated by at least one of the one or more dummy shapes, which is arranged therebetween.

16. The method of claim 9, wherein the one or more dummy shapes are separated from the one or more modified shapes by a non-zero space.

17. An EDA (Electronic design automation) tool, comprising:
a design tool configured to form an integrated chip (IC) design, comprising a graphical representation of a layout used to fabricate an integrated chip;
a local density checking element configured to identify one or more low-pattern-density areas of a modified IC design having a pattern density that results in a processing failure, wherein respective low-pattern-density areas comprise a subset of the modified IC design;
a dummy shape insertion element configured to adjust the pattern density of the modified IC design within the one or more low-pattern-density areas by adding one or more dummy shapes within the one or more low-pattern-density areas;
a data preparation element configured to perform an initial data preparation process on the IC design to generate the modified IC design having modified shapes that are modified forms of shapes within the IC design prior to identifying the one or more low-pattern-density areas, and to further perform a second data preparation process on the IC design that modifies shapes of the one or more dummy shapes within the one or more low-pattern-density areas; and
wherein the one or more dummy shapes are separated from the modified shapes by a non-zero space.

18. The EDA tool of claim 17, wherein the local density checking element is configured to perform a pattern recognition or pattern matching process that compares portions of the modified IC design to a predetermined library of patterns to identify predetermined patterns within the modified IC design that are associated with the one or more low-pattern-density areas.

19. The EDA tool of claim 17, wherein the local density checking element is configured to place a reference layer within the IC design that indicates locations of the low-pattern-density areas of the modified IC design.

20. The EDA tool of claim 17, wherein the dummy shape insertion element is further configured to add one or more additional dummy shapes in the modified IC design at positions outside of the low-pattern-density areas after performing the second data preparation process.

* * * * *